United States Patent [19]
Debus et al.

[11] Patent Number: 4,899,900
[45] Date of Patent: Feb. 13, 1990

[54] SWITCHING BOX

[75] Inventors: Jürgen Debus; Hans-Georg Koch, both of Dietzholztal; Jürgen Zachrei, Dillenburg; Helmut Bütergerds, Eschenburg, all of Fed. Rep. of Germany

[73] Assignee: Rittal-Werk Rudolf Loh GmbH & Co. KG, Fed. Rep. of Germany

[21] Appl. No.: 246,224

[22] Filed: Sep. 19, 1988

[30] Foreign Application Priority Data

Sep. 17, 1987 [DE] Fed. Rep. of Germany ....... 3731547

[51] Int. Cl.$^4$ .............................................. B65D 6/34
[52] U.S. Cl. ..................................... 220/4 R; 220/73; 220/74
[58] Field of Search ................... 220/4 R, 4 F, 73, 74, 220/469; 229/167, 168

[56] References Cited

U.S. PATENT DOCUMENTS

| | | | |
|---|---|---|---|
| 1,193,155 | 8/1916 | Klenk | 220/73 |
| 1,735,375 | 11/1929 | Card | 220/4 R |
| 1,950,582 | 3/1934 | Ware | 220/469 |
| 2,042,848 | 6/1936 | Horn | 220/4 R |
| 2,514,384 | 7/1950 | Frankenstein | 229/168 |
| 2,591,172 | 4/1952 | Lundine | 220/4 R |
| 2,659,515 | 11/1953 | Miller | 220/73 |

FOREIGN PATENT DOCUMENTS

| | | | |
|---|---|---|---|
| 2338570 | 2/1975 | Fed. Rep. of Germany | 220/4 R |
| 79002216 | 6/1979 | Fed. Rep. of Germany | |
| 3344598 | 7/1984 | Fed. Rep. of Germany | |
| 8501810 | 3/1985 | Fed. Rep. of Germany | |
| 8418270 | 8/1986 | Fed. Rep. of Germany | |
| 115742 | 9/1979 | Japan | 220/4 R |
| 165697 | 7/1921 | United Kingdom | 220/4 R |

OTHER PUBLICATIONS

"Katalog-19" Aufbausysteme fur die Elektronik, Feb. 1987.

Primary Examiner—George E. Lowrance
Attorney, Agent, or Firm—Thomas W. Speckman; Douglas H. Pauley

[57] ABSTRACT

The invention relates to a switching box with a framework support formed from framework side units. The switching box is sealed by having a bottom wall, top wall, two side walls, and the open sides of which can be closed by means of a cabinet door and a rear wall, or by means of two cabinet doors. The framework side units form a hollow profile, which have identical series of holes on the two sides that stand perpendicular to one another and are oriented toward the internal space of the box. The framework side units have a protruding sealing bar on the side which toward the external side of the box. The costs of parts and labor necessary for assembly are reduced while retaining universal construction. At least one portion of the framework side units are formed by multiple bending in a single piece with the bottom wall, the top wall and/or the side walls plates. The edging has a first section which extends perpendicular to the internal side of the plate and at its edge makes a transition into a second section which is bent outwardly and parallel to the plate. The end of the second section makes a transition into a third section which lies on the second section and is extended parallel to the plate beyond the second section. The third section is provided with a series of holes. At the end of the third section, a fourth section is bent perpendicular and toward the internal side of the plate and also have a series of holes.

22 Claims, 7 Drawing Sheets

SWITCHING BOX

BACKGROUND OF THE INVENTION

1. Field of the invention

A switching box having a framework support comprising framework side units enclosed by a bottom wall, a top wall and two side walls. The open sides can be closed by a cabinet door and a rear wall, or by two cabinet doors. The framework side units have a hollow profile and an equal series of holes are on two framework sides which stand perpendicular to one another and are oriented toward the internal space of the cabinet. A framework side unit has a protruding sealing bar on the framework side which is oriented to the external side of the cabinet.

2. Description of the Prior Art

A switching box is taught by German Patent DE-PS 33 44 598. The framework support of the switching box has an advantage in that attachment possibilities are created in all directions within the internal space of the cabinet. Another advantage is that the bottom wall, top wall, side walls, rear wall and the cabinet doors can be attached and tightly sealed to the framework support. However, the framework support of the switching box comprises framework side units and the necessary parts and labor for assembly of the switching box is considerably expensive.

SUMMARY OF THE INVENTION

It is an object of this invention to provide a switching box having universal attachment possibilities in which the costs of parts and labor for assembly of the framework support are considerably reduced.

According to this invention, at least one part of the framework side units is formed to the bottom wall, top wall and/or the side walls in one piece. Multiple bending of a plate provides a first section which stands perpendicularly to the internal side of the plate and makes a transition on the end into a second section which is bent outwardly parallel to the plate. The end of the second section makes a transition into a third section which is supported on the second section and extended over the first section. The third section is provided in such area with a series of holes. A fourth section is bent perpendicular to the internal side of the plate and like the third section has a series of holes. Each framework side which is bent from the bottom wall, the top wall or the side walls reduces the costs for parts and labor necessary for assembly. The bent framework sides form a hollow profile. Two sections assembled together having an identical series of holes ensure the capability of a universal assembly. The series of holes in the third and fourth section of the bent edging have the same distance to the edge as is formed by the transition from the third section to the fourth section.

The fourth section of the bent edging is reinforced on the end by means of a fifth section which is bent perpendicularly to the first section and thus increases the stability of the framework side.

The bent framework sides form a closed hollow profile by having the fifth section extending up to the first section and being perpendicular to the first section and having a sixth section of the bent edging attached to the first section. For reasons of accessibility for the connecting process, the sixth section is bent at the end of the fifth section toward the internal side of the plate.

A closed hollow profile for the framework side is formed by the fourth section extending to the internal side of the plate. The framework side is edged on the end by a fifth section which is directed parallel to the plate abutting on its internal side and is connected for accessibility in the connecting process. The fifth section is edged on the side of the fourth section which is oriented away from the first section.

All the framework sides of the framework support can be produced in a single piece with the bottom wall, top wall and both side walls if on the bottom wall and the top wall, framework side units are bent only on those edges oriented toward the open sides, unlike the framework sides which are bent on all edges of the side walls.

Since the bottom wall, the top wall and both side walls are preferably welded together on the impacting edges, the framework support has a simplified construction. The horizontal framework sides of the side walls have both the third and fourth sections connected to the first section of the edging and a border which is edged perpendicularly to the inner side is attached to the correspondingly oriented edges of the bottom wall and the top wall.

According to one embodiment of this invention, the framework supports can be divided with the bottom wall and the top wall having framework side units located on all edges, whereas the side walls have framework side units only located on the vertical edges. Since the bottom wall, top wall and both side walls are welded together in the area of the framework sides which impact against one another, the framework support can be simplified by the edges of the bottom wall and the top wall which are oriented adjacent the side walls having a framework side unit which is edged and which only consists of a third section and a fourth section. The third section is bent perpendicularly to the plate, the fourth section projects outwardly parallel to the plate on the third section, and a perpendicularly bent border is attached on the edges of the side walls which are oriented inwardly.

In another embodiment according to this invention, the framework comprises four separate framework sides each edged on all edges of the side walls. The bottom wall and the top wall are connected with framework side units in the area of the open sides which are formed as sections of a hollow profile. The bottom wall and the top wall is constructed in a box-like manner and has perpendicularly edged borders. The bottom wall and the top wall are connected with the oriented framework side units of the side walls and the separate framework sides. All framework side units whether edged on the bottom wall, top wall, or constructed as a section of hollow profile, form a framework support and are connected with one another by means of suitable corner connectors familiar in the art, or are directly welded to one another.

In order for the framework side units at the edges of the switching box to complete the framework support, the framework side units are oriented to one edge impacting against one another and are connected with one another, preferably welded.

The costs for parts and labor necessary for assembly of a switching box can again be considerably reduced by having both side walls and the top wall bent into a U-shaped housing part from one cut section. The framework side units can be bent on the edges oriented to the open sides. The edges of the housing part oriented to the bottom can have perpendicularly edged borders. Also, the open bottom of the switching box can be closed by means of a framework formed from four hollow profile sections, such framework being connected with the borders of the side walls.

If the base of the switching box is closed, the construction can be so modified that the framework is part of a bottom plate on which the framework side units are edged. Thus, the bottom wall can have openings through it and cables can be inserted into the interior of the cabinet.

BRIEF DESCRIPTION OF THE DRAWINGS

The invention is illustrated in greater detail by means of various examples shown in the drawings wherein.

DESCRIPTION OF PREFERRED EMBODIMENTS

The costs for parts and labor necessary for assembly of the switching box is reduced by at least one part of the framework side units of the framework support being bent edges on the bottom wall, top wall and/or both side walls of the cabinet body. The multiple bending has two sections of the edgings standing at a right angle to one another and each are provided with a series of holes. The sealing bars necessary for the tight sealing of the open sides project outwardly.

Various embodiments of the bent edged framework side units are shown in FIGS. 1-4. The plate (B) can be a bottom wall, top wall or side wall. A first section (a) is bent perpendicular to the internal side of the plate (B). The end of the first section (a) makes a transition into the second section (b) which extends from the external side of the first section (a), projects parallel to the plate (B) and together with the connecting third section (c), forms a sealing bar. The third section (c) makes contact with the second section (b), and extends beyond the first section (a). At the end of the third section (c), the fourth section (d1-d4) is bent vertically toward the internal side of the plate (B). The third section (c) and the fourth section (d1-d4) have a series of holes (27) which are symmetrically formed and aligned with one another. The distances of the series of holes (27) are the same from the edge which is formed by the transition from the third section (c) to the fourth section (d1-d4).

Figure 2:
FIGS. 2-4 show cross-sectional views of other embodiments of bent edged framework side units.

As FIG. 2 shows, the framework side units, particularly the fourth section (d1) of the edging, can be reinforced by means of a fifth section (e1) which is located on the end of the fourth section (d1) and is bent perpendicular toward the first section (a).

Figure 3:

As shown in FIG. 3, the edged framework side unit can form a closed hollow profile. The fifth section (e2) is extended to the first section (a) and makes a transition into a sixth section (f) which is parallel to the first section (a). The sixth section (f) abuts the first section (a) and both sections can be connected, preferably welded. The sixth section (f) is bent in a direction toward the inner side of plate (B), in order to have better accessibility for a connecting process.

Figure 4:

FIG. 4 shows another embodiment of a closed hollow cross section of the edged framework side unit. The fourth section (d4) extends in this up to the internal side of the plate (B). The fourth section (d4) makes a transition into a perpendicularly bent fifth section (e3) which is bent and turned in the direction away from first section (a). The fifth section (e3) can easily be attached to the inner side of the plate (B).

Figure 5:
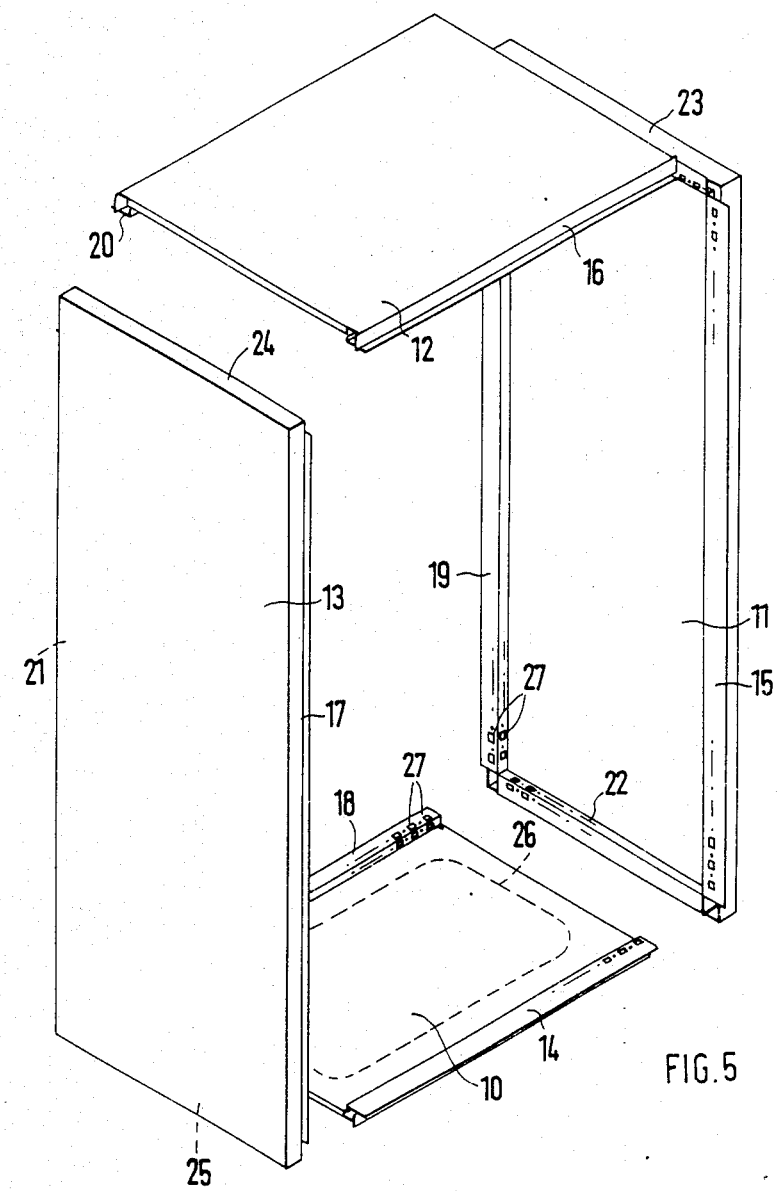
FIG. 5 shows an exploded perspective view of a bottom wall, top wall and both side walls which form a cabinet body of a switching box open to the front and to the rear according to one embodiment of this invention.

FIG. 5 shows a bottom wall (10), the top wall (12) and both side walls (11 and 13), which comprise the cabinet body of the switching box. The forward and the rear sides of the cabinet remain open. The framework support is formed by the framework side units (14-25), which are on corresponding edges of the bottom wall (10), top wall (12) and the side walls (11 and 13) having multiple bends in accordance with the type shown in FIGS. 1-4. In an assembled position, the sections (c and d1-d4) with the series of holes (27) are oriented toward the internal space of the cabinet. In the embodiment of this invention as shown in FIG. 5, the framework side units (14 and 18) are bent on the edges of the bottom wall (10) and are oriented toward the open sides of the body of the cabinet, and similarly on the top wall (12), the framework side units (16 and 20) are bent in a single unit. Both side walls (11 and 13) have bent edged framework side units (15, 19, 22 and 23, and 17, 21, 24 and 25) with all the edges having bent edged framework side units. The bottom wall (10), the top wall (12) and the side walls (11 and 13) are connected with one another, preferably welded, in the area of the impacting edges. An opening (26) can be positioned in the bottom wall (10) through which cables can be brought into the switching box.

Figure 1:
FIG. 1 shows a cross-sectional view of one embodiment according to this invention of framework side units bent on the edge of a plate and constructed as a hollow profile.
Figure 6:
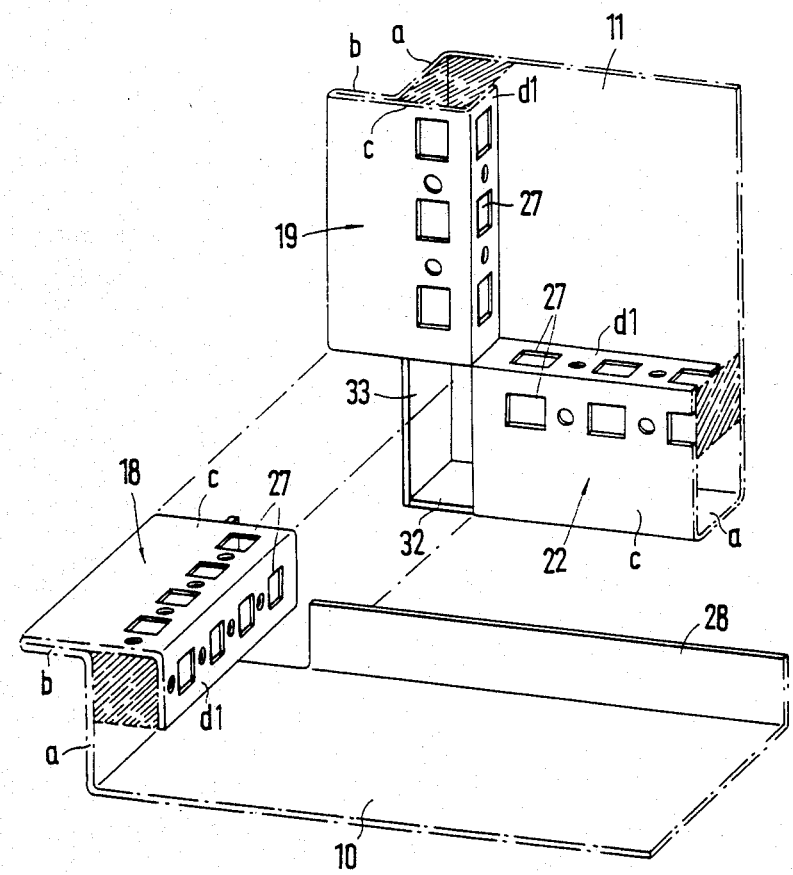
FIG. 6 shows an exploded perspective view of a corner area having the edgings of a side wall and bottom wall for the switching box in accordance with FIG. 5.

FIG. 6 shows the side wall (11) and the bottom wall (10) forming a corner of the body of the cabinet in an unassembled position. The vertical edge of the side wall (11) has bent edged framework side unit (19), as shown in FIG. 1. This framework side unit (19) ends before the horizontal framework side unit (22) in which the first section (a) immediately makes a transition into the third section (c) with a series of holes (27). The fourth section (d1-d4) has a series of holes (27) and connects perpendicular to the internal side of the side wall (11) in an upright manner. In the corner area, the first sections (a)

of the framework side units (19 and 22) are used as bent borders (32 and 33). In order for the bottom wall (10) to be able to connect easily with the corresponding edge of the side wall (22), the border (28) is bent inwardly. FIG. 6 shows the connection of the bottom wall (10) and the side wall (11) in the area of the rear, lower edge of the cabinet body. The remaining edge areas between the bottom wall (10) and the side walls (11 and 13) are designed in a similar manner, and the connections between the top wall (12) and the side walls (11 and 13) are also similarly designed.

Figure 7:
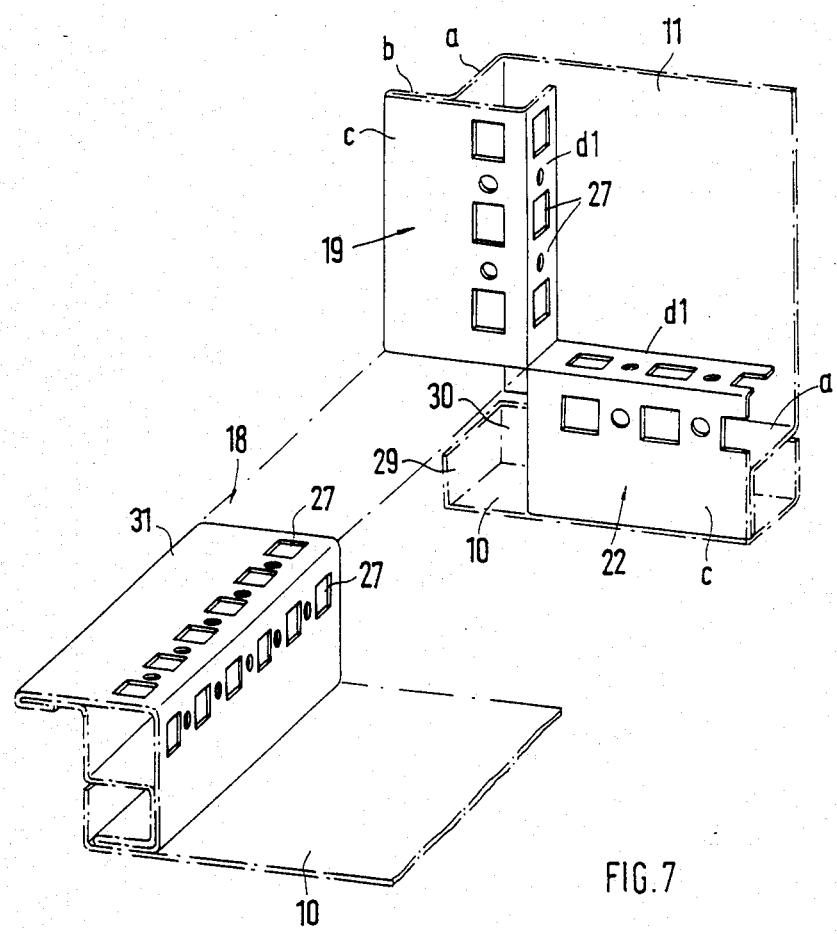
FIG. 7 shows an exploded perspective view of a corner area of a modification for the bottom wall of a switching box in accordance with FIG. 5.

As shown in FIG. 7, the body of the cabinet can also comprise a bottom wall (10) and a top wall (12) which are constructed in a different manner. The side walls (11 and 13) are the same as in the cabinet body in accordance with FIG. 5. The bottom wall (10) is constructed in a box-like manner and has bent borders (29 and 30). The framework side units (14 and 18) constructed as hollow profile sections (31) complete the framework support in the area of the bottom wall (10).

Figure 8:
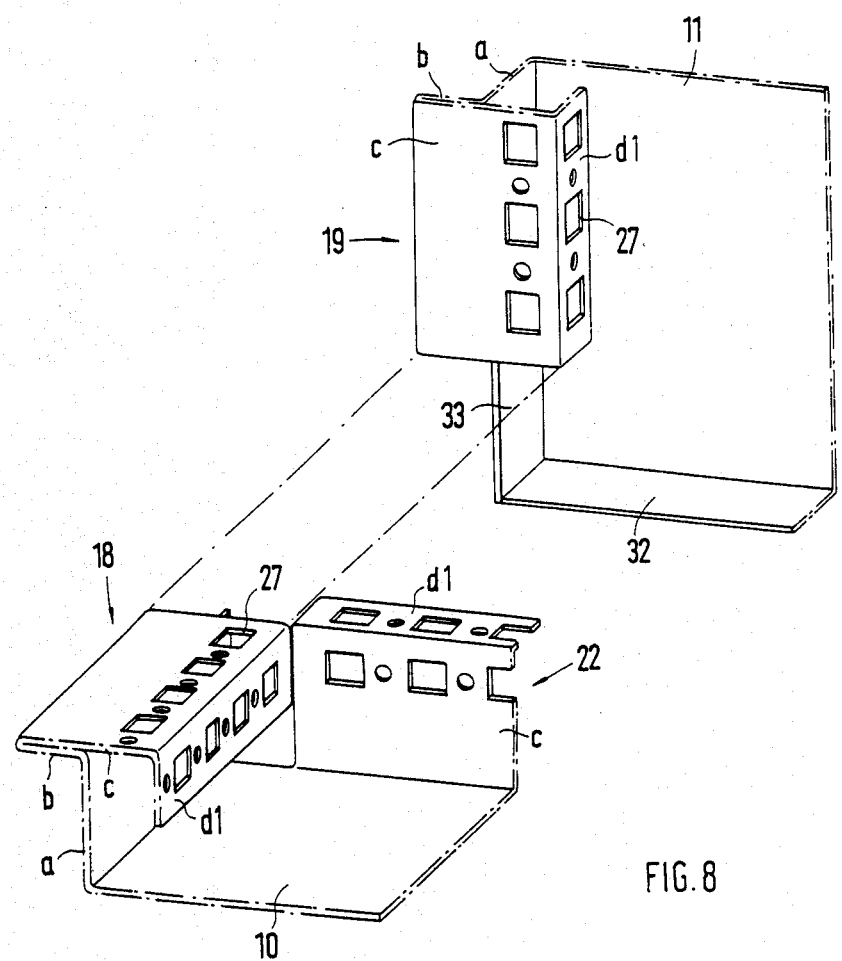
FIG. 8 shows an exploded perspective view of a corner area where the edgings of the vertical edges of the side wall and all edges of the bottom wall form framework side units according to one embodiment of this invention.
Figure 9:
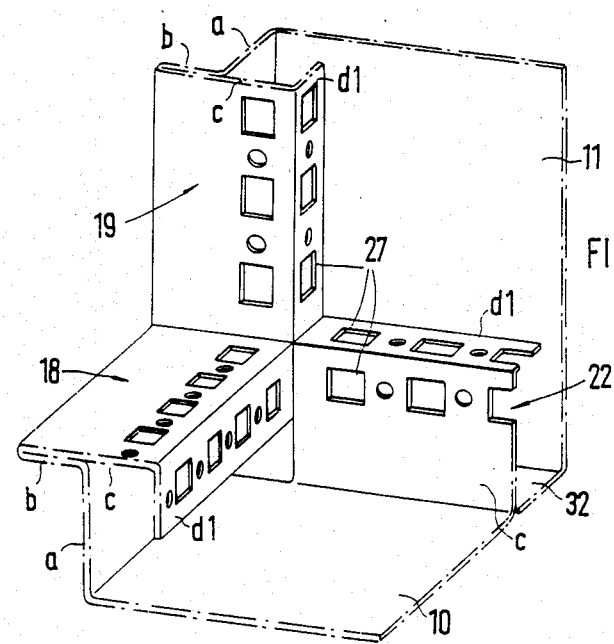
FIG. 9 shows a perspective view of a corner area of an assembled edge of a switching box with the side wall and the bottom wall in accordance with FIG. 8.

Another embodiment of the cabinet body of the switching box is depicted in FIG. 8. The bottom wall (10) and the top wall (12) support edged framework side units (14, 18, 22 and 25, and 16, 20, 23 and 24) on all edges. The side walls (11 and 13) only support edged framework side units (15 and 19, or 17 and 21) on the vertical edges. As the corner area of the side wall (11) and the bottom wall (10) are shown in FIG. 8, the framework side units are bent on the vertical edges of the side walls (11 and 13) in a manner as shown in FIGS. 1-4. The framework side units end before the corner in order to provide space for the framework side units of the bottom wall (10). The first section (a) of the framework side unit is extended as a border (33) up to the corner. The horizontal edges of the side walls (11 and 13) have a bent border (32). The framework side units (22 and 25) of the bottom wall which are oriented toward the border (32) of the side walls (11 and 13) have only the third and fourth sections (c and d1–d4) of the edging with the series of holes (27). In an assembled position, the framework side units form a complete framework support, as the framework side units (18, 19 and 22) which meet in the corner as shown in FIG. 9. All contact areas are preferably welded so that the bottom wall (10), the top wall (12) and the side walls (11 and 13) are connected with the body of the cabinet.

Figure 11:
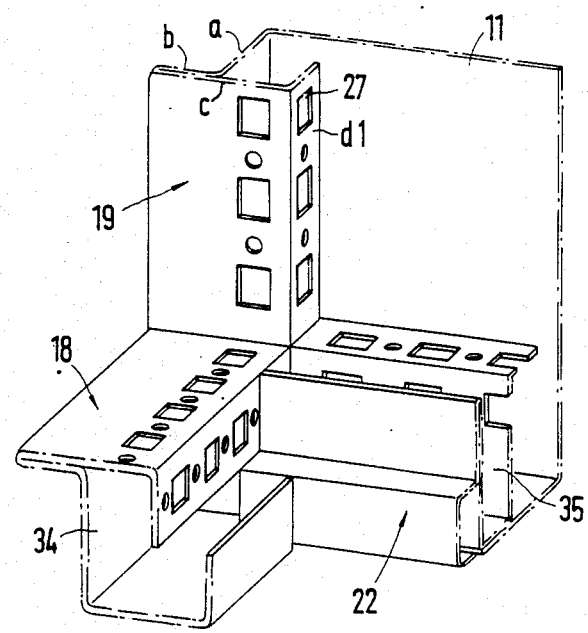
FIG. 11 shows a perspective view of assembled corner area of the switching box in accordance with FIG. 10.
Figure 10:
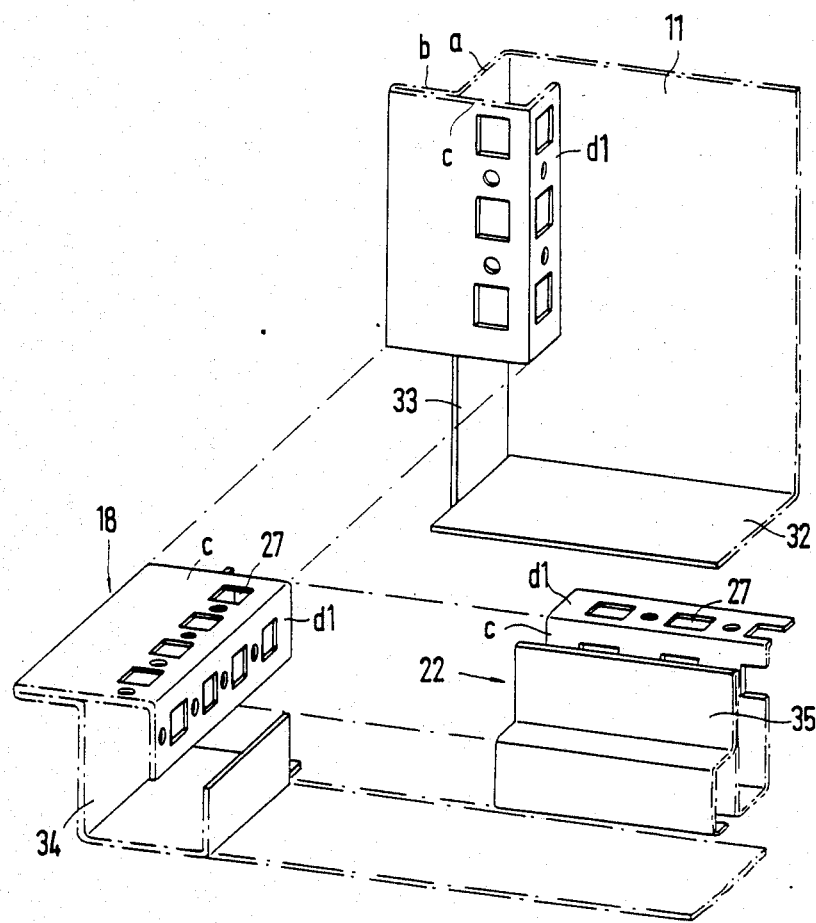
FIG. 10 shows an exploded perspective view of the corner area of a housing part having two side walls and a top wall abutting a separate framework side unit of a framework closing the bottom according to one embodiment of this invention.

FIGS. 10 and 11 show another embodiment of this invention where the side walls (11 and 13) correspond to the side walls (11 and 13) as shown in FIG. 8. The side walls (11 and 13) can also be bent out of a piece of suitable material cut to size with the top wall (12) and thus form a U-shaped housing part in which framework side units as shown in FIGS. 1–4 are bent on the edges which are oriented to the open sides of the cabinet body.

To complete the framework support, four hollow profile sections (34 and 35) can be used to close the bottom of the body of the cabinet. The framework side units have sections (c and d1–d4) with a series of holes (27) and can have bends for the support of a bottom plate. Framework side units constructed internally as hollow profile sections are welded into the bends between the top wall (12) and the side walls (11 and 13) and provides for a universal assembly, even in the area of the top wall (12).

We claim:

1. A switching box comprising: a framework support formed by framework side units, said framework support being closed by a bottom wall, a top wall and two side walls, said framework support having open sides which can be closed by at least one of a cabinet door and a rear wall, said framework side units each having a hollow profile, each side of said framework side units extending perpendicular to one another and oriented toward an internal space of said switching box having an equal series of holes on two perpendicular said framework side units oriented toward said internal space, and a protruding sealing bar extending from said side of said framework side unit facing an external side of said switching box, said framework side units comprising at least a portion of each said framework side unit attachable to another said framework side unit by having a multiple bending of a one piece plate (B) to at least one of said bottom wall (10), said top wall (12) and said side walls (11, 13), each said framework side unit having a first section formed perpendicular to an internal side of said plate (B), said first section having a first transition into a second section formed outwardly from said first section parallel to said plate (B), said second section making a second transition into a third section which extends back along said second section and projects inward beyond said first section, said third section having a first series of holes (27), said third section making a third transition into a fourth section extending perpendicular from said third section toward said internal side of said plate (B), said fourth section having a second series of holes (27).

2. A switching box in accordance with claim 1 wherein said first series of holes (27) in said third section and said second series of holes in said fourth section have the same distance to an edge formed by said third transition from said third section to said fourth section.

3. A switching box in accordance with claim 1 wherein said fourth section is reinforced by said fourth section making a fourth transition into a fifth section which is formed perpendicular toward said first section.

4. A switching box in accordance with claim 3 wherein said fifth section extends up to said first section, abuts and is parallel to said first section, and makes a fifth transition into a sixth section which is attached to said first section.

5. A switching box in accordance with claim 4 wherein said sixth section is formed toward said internal side of said plate (B).

6. A switching box in accordance with claim 1 wherein said fourth section extends up to said internal side of said plate (B), said fifth section is parallel to said plate (B), and said fifth section abuts and connects to said internal side of said plate (B).

7. A switching box in accordance with claim 6 wherein said fifth section is formed away from said first section.

8. A switching box in accordance with claim 1 wherein said bottom wall (10) and said top wall (12) have said framework side units (14, 18 and 16, 20 bent on bottom wall edges and top wall edges oriented toward said open sides, said framework side units (15, 19, 22, 23, 17, 21, 24 and 25) of said side walls (11, 13) are bent on all side wall edges.

9. A switching box in accordance with claim 8 wherein said framework side units (22, 23, 24 and 25) of said side walls (11, and 13) have said third section and said fourth section attached to said first section and a border (28) formed perpendicular to said internal side and attached to corresponding said bottom wall edges of said bottom wall (10) and said top wall edges of said top wall (12).

10. A switching box in accordance with claim 1 wherein said bottom wall (10) and said top wall (12) have said framework side units (14, 18, 22, 25, 16, 20, 23 and 24) with multiple bends on all bottom wall edges and all top wall edges and said side walls (11 and 13) have said framework side units (15, 19, 17 and 21) with said multiple bends only on their vertical edges.

11. A switching box in accordance with claim 10 wherein said bottom wall edges of said bottom wall (10) and said top wall edges of said top wall (12) oriented toward said side walls (11 and 13) have framework side units (22-25) each comprising said third section formed perpendicular toward said plate (B), said fourth section is parallel to said plate (B) and protrudes perpendicular outwardly on said third section, and a perpendicularly formed border (32) is attached to side wall edges of said side walls (11 and 13).

12. A switching box in accordance with claim 1 wherein said framework side units (15, 17, 19, 21, 22, 23, 24 and 25) have multiple bends on all side wall edges of said side walls (11 and 13), and said bottom wall (10) and said top wall (12) are attached to said framework side units (14, 16, 18 and 20) in an area of said open sides constructed as sections (31) with said hollow profile.

13. A switching box in accordance with claim 12 wherein said bottom wall (10) and said top wall (12) are constructed in a box-like manner and have perpendicularly edged borders (29 and 30).

14. A switching box in accordance with claim 1 wherein said framework side units (14, 15, 22; 15, 16, 23; 16, 17, 24; 14, 17, 25; 18, 19, 22; 19, 20, 23; 20, 21, 24; 18, 21 24) are oriented, abutted and attached to one another to form a corner section.

15. A switching box in accordance with claim 1 wherein said side walls (11 and 13) and said top wall (12) are formed into a U-shaped housing part from one piece, said framework side units (15, 16, 17; 19, 20, 21) are bent on side edges oriented toward said open sides, housing part edges of a housing part oriented toward said bottom wall (10) have perpendicularly bent borders (32), and an open bottom of said switching box is closed by a frame formed by four hollow profile sections (34 and 35) which are connected with said perpendicularly bent borders (32) of said side walls (11 and 13).

16. A switching box in accordance with claim 15 wherein said frame is part of said bottom wall (10) on which said framework side units (14, 18, 22 and 25) are formed.

17. A switching box in accordance with claim 2 wherein said fourth section is reinforced by said fourth section making a fourth transition into a fifth section which is formed perpendicular toward said first section.

18. A switching box in accordance with claim 2 wherein said fourth section extends up to said internal side of said plate (B), said fifth section is parallel to said plate (B), and said fifth section abuts and connects to said internal side of said plate (B).

19. A switching box in accordance with claim 7 wherein said bottom wall (10) and said top wall (12) have said framework side units (14, 18 and 16, 20 bent on bottom wall edges and top wall edges oriented toward said open sides, said framework side units (15, 19, 22, 23, 17, 21, 24 and 25) of said side walls (11, 13) are bent on all side wall edges.

20. A switching box in accordance with claim 6 wherein said bottom wall (10) and said top wall (12) have said framework side units (14, 18, 22, 25, 16, 20, 23 and 24) with multiple bends on all bottom wall edges and all top wall edges and said side walls (11 and 13) have said framework side units (15, 19, 17 and 21) with said multiple bends only on their vertical edges.

21. A switching box in accordance with claim 6 wherein said framework side units (15, 17, 19, 21, 22, 23, 24 and 25) have multiple bends on all side wall edges of said side walls (11 and 13), and said bottom wall (10) and said top wall (12) are attached to said framework side units (14, 16, 18 and 20) in an area of said open sides constructed as sections (31) with said hollow profile.

22. A switching box in accordance with claim 7 wherein said side walls (11 and 13) and said top wall (12) are formed into a U-shaped housing part from one piece, said framework side units (15, 16, 17; 19, 20, 21) are bent on edges oriented toward said open sides, housing part edges of a housing part oriented toward said bottom wall (10) have perpendicularly bent borders (32), and an open bottom of said switching box is closed by a frame formed by four hollow profile sections (34 and 35) which are connected with said perpendicularly bent borders (32) of said side walls (11 and 13).

* * * * *